United States Patent [19]

Moore

[11] 4,163,938

[45] Aug. 7, 1979

[54] CALIBRATING DEVICE FOR CONTROL STATIONS AND INDICATORS

[75] Inventor: James O. Moore, Worcester, Pa.

[73] Assignee: Moore Products Co., Spring House, Pa.

[21] Appl. No.: 901,414

[22] Filed: May 1, 1978

[51] Int. Cl.² .................... G01R 1/38; G01R 1/02; G01R 35/00

[52] U.S. Cl. .................... 324/74; 73/1 R; 324/130

[58] Field of Search .................... 324/130, 74; 73/1 R

[56] References Cited

PUBLICATIONS

Allen, W.; "High-Accuracy Calibrator. . .", Electronics, Mar. 3 1977, pp. 104-105.

Primary Examiner—Rudolph V. Rolinec
Assistant Examiner—Ernest F. Karlsen
Attorney, Agent, or Firm—Zachary T. Wobensmith, 2nd; Zachary T. Wobensmith, III

[57] ABSTRACT

A calibrating device is disclosed for insertion between a control station and its indicators, preferably of the bar graph type, with provisions for establishing accurate reference voltages available at marked jacks for use and specifically for checking the calibration of the indicating elements, and to provide for utilization of one or both indicators as a precision voltmeter for checking the potential of various points in the circuitry. Provisions are also made for bypass plugging in so that the indicators operate in a normal manner as if the calibrator were not present. The normal jacks also provide convenient access to the set-point and variable voltage of the station and facilitate the measuring of these voltages by an external digital voltmeter if desired.

4 Claims, 3 Drawing Figures

CALIBRATING DEVICE FOR CONTROL STATIONS AND INDICATORS

BACKGROUND OF THE INVENTION

1. Field of the Invention

This invention relates to calibrating apparatus and more particularly to such apparatus for checking the calibration of indicators of the bar graph type as well as for other purposes in connection with control stations.

2. Description of the Prior Art

It has heretofore been proposed to provide electronic controllers of various types including proportional, proportional plus integral, proportional plus integral plus derivative, and proportional plus derivative.

It has been proposed to provide bar graph display panels that have analog displays with digital accuracy for process control and other purposes. Examples of bar graph panels are disclosed in the U.S. patent to Maloney, U.S. Pat. No. 3,973,166 and controls for such a panel are shown in the U.S. patent to Saxon, U.S. Pat. No. 3,967,158.

In my prior application for letters patent of the United States filed July 13, 1977, Ser. No. 815,101 now U.S. Pat. No. 4,110,665, a control circuit for a bar graph display panel is shown which has since been embodied in module form and for which the calibrator of my invention is suitable although not limited in its use to the specific display panel therein disclosed.

Various types of testing and calibrating equipment have heretofore been proposed but none of the devices now available have the versatility and precision of the calibrating device of my invention.

SUMMARY OF THE INVENTION

In accordance with the invention, a calibrator is provided for insertion between a control station and its indicators, preferably of the bar graph type, with internal circuitry powered by voltages from the control station and connected for normal operation except for two terminals which carry the signals to the indicating elements. The calibrator has a plurality of available functions, in one of which, by a zener diode and precision voltage divider, a series of accurate reference voltages are available at marked jacks for checking the accuracy of the indicating elements, in another of which the indicators act as precision plus or minus voltmeters, and in another of which the indicators operate in the normal manner as if the calibrator were not present.

It is the principal object of the invention to provide a calibrator for indicators, preferably of the bar graph type which provides a quick and easy check of the accuracy of operation of the indicators.

It is a further object of the invention to provide a calibrator of the character aforesaid which can be used to check the voltage potential at various points in the control station circuitry associated with the indicators.

It is a further object of the invention to provide a calibrator of the character aforesaid which is capable of providing an amplification circuitry for measuring small voltage deviations.

It is a further object of the invention to provide a calibrator of the character aforesaid which can be connected to allow the indicators to operate normally without removal of the calibrator from its connection in the indicator circuitry.

Other objects and advantageous features of the invention will be apparent from the description and claims.

DESCRIPTION OF THE DRAWINGS

The nature and characteristic features of the invention will be more readily understood from the following description taken in connection with the accompanying drawings forming part hereof in which.

It should, of course, be understood that the description and drawings herein are illustrative merely and that various modifications and changes can be made in the structure disclosed without departing from the spirit of the invention.

DESCRIPTION OF THE PREFERRED EMBODIMENTS

Figure 1:
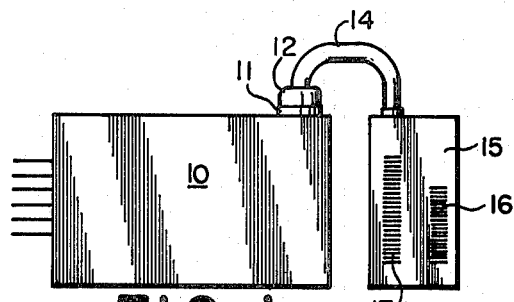
FIG. 1 is a view in elevation of a control station with an indicator module connected thereto.

Referring now more particularly to the drawings in FIG. 1 thereof a control station 10 is shown which can be a Syncro 350 control station as produced and sold by the Moore Products Co., Spring House, Pa., 19477, and in which the bar graph indicators are employed with internal circuitry as shown in my application Ser. No. 815,101, referred to above.

This control station 10 has a receptacle 11 with a plug 12 from one end of a cable 14 connected thereto, the other end of the cable 14 being connected to an indicator module 15 which has set-point and measured-variable indicators to provide a visible analog bar graph display.

Figure 2:
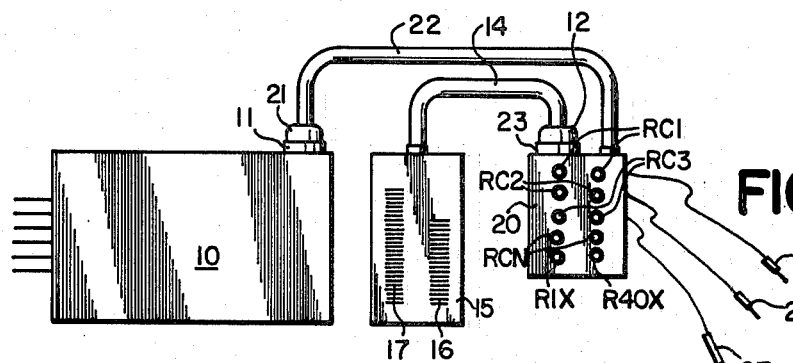
FIG. 2 is a view similar to FIG. 1 showing the calibrator of my invention connected between the control station and the indicator module.

The indicator module 15 has a measured-variable indicator 16 at the right side as seen in FIGS. 1 and 2 and a set-point indicator 17 at the left side. Both indicators 16 and 17 are calibrated to indicate zero-scale for 1 volt and full-scale for 5 volts applied to their input circuits.

Referring now to FIG. 2, the calibrator 20 is illustrated with a plug 21 inserted into receptacle 11 of station 10, and connected to the calibrator 20 by a cable 22.

The cable 14 from indicator module 15 has plug 12 inserted into a receptacle 23 of the calibrator 20.

The calibrator 20 has connected thereto plugs 25 and 26 providing connectors to indicators 16 and 17 respectively and probe 27 for measuring deviation voltage as described hereafter.

The calibrator 20 has receptacle jacks on the front face starting from the top, being RC1 at a constant value of 5 volts, RC2 at a constant value of 3 volts, RC3 at a constant value of 1 volt, RCN for normal operation of the control station without utilizing the calibrator, R1X for a zero deviation potential and R40X for an amplified voltage of 40 times the measured voltage deviation.

Figure 3:
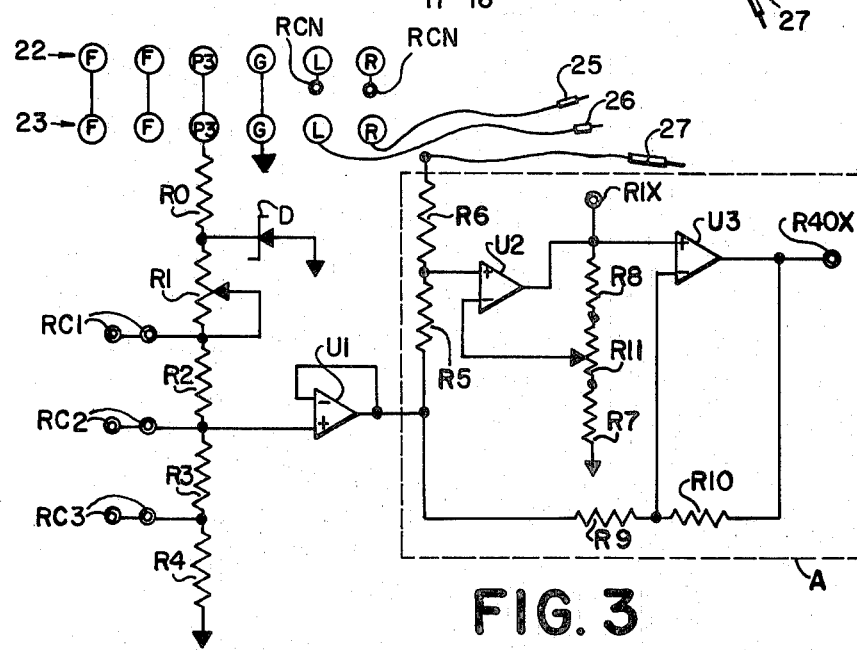
FIG. 3 is a diagrammatic view of the internal circuitry of the calibrator of my invention.

Referring to the circuit diagram of FIG. 3, the conductors in cable 22 and receptacle 23 are identified by the following symbols: F, those normally connecting the indicator 15 to the control station 10 and not involved in the operation of the calibrator; P3, connected to the plus 24 volt source of the control station 10; G, a common ground circuit and L and R connected to the left and right indicating circuits of the indicator 15 and control station 10.

A zener diode D, and resistors R0, R1, R2, R3, R4 supplied by station power from conductor P3 provide a regulated source of 1, 3 and 5 volts connected to the jacks RC3, RC2, and RC1 respectively. The resistor R1 is adjustable for trimming the regulated voltage.

An operational amplifier U1 is used to buffer the 3 volts from RC2 for use as a reference voltage in a two-stage amplifier A, for the deviation probe 27. The first stage of this amplifier, comprising operational amplifier U2 with resistors R5, R6, R7, R8 and R11 and jack R1X, provides unity gain and 3 volts bias to the voltage contacted by the probe 27 and connects it to the output jack R1X. One of the plugs 25 or 26 may be inserted into the jack R1X to provide an indication on one of the indicators 16 or 17 of the voltage at the probe 27. The 3-volt bias permits a mid-scale indication for zero probe-voltage and thus provides for indicating both positive and negative voltages at the probe 27.

Resistors R5 and R6 may preferably be of sufficiently high values to protect the operational amplifier U2 from damage by any voltage likely to be encountered by the probe 27. R11 is a variable resistor adjustable by the user to set one of the indicators 16 or 17 to exactly mid-scale when the probe 27 is contacting a reference point of zero potential.

The second stage of the two-stage amplifier, comprising operational amplifier U3 and resistors R9 and R10 and jack R40X, provides a gain of 40 times and maintains the 3-volt bias so that very small plus or minus deviations from zero-voltage at the probe 27 may be displayed when the plugs 25 or 26 are inserted into the jack R40X.

The mode of operation will now be pointed out.

The control station 10, indicator module 15 and calibrator 20 are connected as shown in FIGS. 2 and 3. If normal operation is desired without using the calibrator, then the plugs 25 and 26 are inserted in the jacks RCN and the control station 10 and indicators 16 and 17 will operate normally.

If it is desired to check the calibration of the bar graph indicators 16 and 17, then the plugs 25 and 26 are plugged into the jacks RC1, RC2, or RC3 which, for the indicators illustrated, will provide full scale indication, mid-scale indication and zero indication, respectively.

If it is desired to check other portions of the circuitry (not shown) of the control station 20 using the indicators 16 and 17 as precision voltmeters, then plugs 25 or 26 can be used as probes to measure any voltage within the range of the indicators 16 and 17.

If it is desired to measure the deviation from zero of other portions of the circuitry (not shown) of the control station 20, using the indicators 16 and 17 as precision voltmeters, then the plugs 25 or 26 can be inserted into jacks R1X or R40X to provide plus and minus indication of the deviation from zero potential of the point contacted by probe 27.

If it is desired to use the indicators 16 and 17 to check the logic levels of the digital portions of the circuitry (not shown) of the control station 20, then plugs 25 or 26 should be inserted into the jack R1X and when so connected the indicator will show full scale when the probe 27 contacts a logic 1 level and zero scale for a logic 0 level.

If it is desired to measure the set-point and measured-variable voltages of the station with greater precision than provided by the indicators 16 and 17, this can be accomplished by using the jacks RCN and an external digital voltmeter (not shown) which can be inserted therein for such measurement.

It will thus be seen that a calibrator has been provided with which the objects of the invention are achieved.

I claim:

1. Calibrating apparatus for use in connection with a control station which has separable voltage responsive indicating means, said control station and said indicating means each having separable connecting members to provide electrical connections between said control station and said indicating means, said calibrating apparatus comprising a housing for interposition between said control station and said indicating means said housing containing internal circuit means with accessible connectors to which said connecting members are respectively connected, said internal circuit means communicating with said indicating means through said connecting members, said internal circuit means including means for providing a plurality of sources of different reference voltages, said internal circuit means being powered by said control station, said internal circuit means having a plurality of terminals to which the plurality of sources of different reference voltages are applied said terminals being accessible through the housing, and test leads for selective connection to selected terminals for connection of said indicating means to selected ones of said different reference voltages to determine the response of the indicating means thereto.

2. Calibrating apparatus as defined in claim 1 in which said test leads are selectively connectable to said terminals for direct operation of said indicating means from said control station.

3. Calibrating apparatus as defined in claim 1 in which said housing has a test probe with additional circuit means, said additional circuit means has an output terminal to which said test leads are connectable and whose voltage differs from a constant value by an amount equal to the deviation of the voltage on said test probe from zero voltage.

4. Calibrating apparatus as defined in claim 3 in which said additional circuit means has an output terminal to which said test leads are connectable and whose voltage differs from a constant value by an amplified amount of the deviation of the voltage on said test probe from zero voltage.

* * * * *